(12) United States Patent
Zlotnik et al.

(10) Patent No.: US 11,973,504 B2
(45) Date of Patent: Apr. 30, 2024

(54) MULTI-RESET AND MULTI-CLOCK SYNCHRONIZER, AND SYNCHRONOUS MULTI-CYCLE RESET SYNCHRONIZATION CIRCUIT

(71) Applicant: Intel Corporation, Santa Clara, CA (US)

(72) Inventors: Leon Zlotnik, Camino, CA (US); Lev Zlotnik, Holon (IL); Jeremy Anderson, Hillsboro, CA (US)

(73) Assignee: INTEL CORPORATION, Santa Clara, CA (US)

( * ) Notice: Subject to any disclaimer, the term of this patent is extended or adjusted under 35 U.S.C. 154(b) by 4 days.

(21) Appl. No.: 17/762,677

(22) PCT Filed: Aug. 17, 2020

(86) PCT No.: PCT/US2020/046704
§ 371 (c)(1),
(2) Date: Mar. 22, 2022

(87) PCT Pub. No.: WO2021/080671
PCT Pub. Date: Apr. 29, 2021

(65) Prior Publication Data
US 2022/0255541 A1 Aug. 11, 2022

Related U.S. Application Data

(60) Provisional application No. 62/926,255, filed on Oct. 25, 2019.

(51) Int. Cl.
*H03K 5/135* (2006.01)
*G06F 1/24* (2006.01)
(Continued)

(52) U.S. Cl.
CPC .............. *H03K 5/135* (2013.01); *G06F 1/24* (2013.01); *H03K 19/17716* (2013.01); *H03K 19/20* (2013.01)

(58) Field of Classification Search
None
See application file for complete search history.

(56) References Cited

U.S. PATENT DOCUMENTS 11,036,268 B2 * 6/2021 Srivastava ............... G06F 1/12
2013/0043904 A1 2/2013 Ivory
(Continued)

FOREIGN PATENT DOCUMENTS

CN 102571050 B 7/2012
JP 2014219786 A 11/2014

OTHER PUBLICATIONS

International Search Report and Written Opinion dated Nov. 27, 2020 for International Application No. PCT/US2020/044787, 8 pages.

(Continued)

*Primary Examiner* — Cassandra F Cox
(74) *Attorney, Agent, or Firm* — NICHOLSON DE VOS WEBSTER & ELLIOTT LLP

(57) ABSTRACT

An asynchronous multi-cycle reset synchronization circuit that can correlate any number of resets and synchronous clocks with simultaneous reset de-assertion and removal of reset assertion crossing hazards. The asynchronous multi-cycle reset synchronization circuit can also be paired with a synchronous multi-cycle reset synchronization circuit to correlate same domain asynchronous and synchronous resets. Also described is a synchronous reset multi-cycle synchronization circuit that correlates with any number of asynchronous resets and guarantees simultaneous reset de-assertion.

23 Claims, 17 Drawing Sheets

(51) Int. Cl.
    *H03K 19/17704*    (2020.01)
    *H03K 19/20*    (2006.01)

(56) References Cited

U.S. PATENT DOCUMENTS

| | | |
|---|---|---|
| 2013/0043905 A1 | 2/2013 | Langadi |
| 2014/0140159 A1 | 5/2014 | Fishleigh |
| 2018/0182440 A1* | 6/2018 | Khare .............. H03K 19/00392 |

OTHER PUBLICATIONS

International Preliminary Report on Patentability, PCT App. No. PCT/US2020/046704, dated May 5, 2022, 7 pages.
International Search Report and Written Opinion, PCT App. No. PCT/US2020/046704, dated Nov. 27, 2020, 8 pages.

\* cited by examiner

MULTI-RESET AND MULTI-CLOCK SYNCHRONIZER, AND SYNCHRONOUS MULTI-CYCLE RESET SYNCHRONIZATION CIRCUIT

CROSS REFERENCE TO RELATED APPLICATIONS

This patent application is a U.S. National Phase Application under 35 U.S.C. § 371 of International Application No. PCT/US2020/046704, filed Aug. 17, 2020, entitled MULTI-RESET AND MULTI-CLOCK SYNCHRONIZER, AND SYNCHRONOUS MULTI-CYCLE RESET SYNCHRONIZATION CIRCUIT, which claims the benefit of U.S. Provisional Application No. 62/926,255 filed on Oct. 25, 2019, the entire contents of which are hereby incorporated by reference herein.

BACKGROUND

Digital logic with more than one clock-reset pair does not correlate the de-assertion of multiple resets and clocks. Digital logic with synchronous reset causes excess leakage and consumes high-priority routing. Currently, synchronous and asynchronous resets in a same circuit are not correlated.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
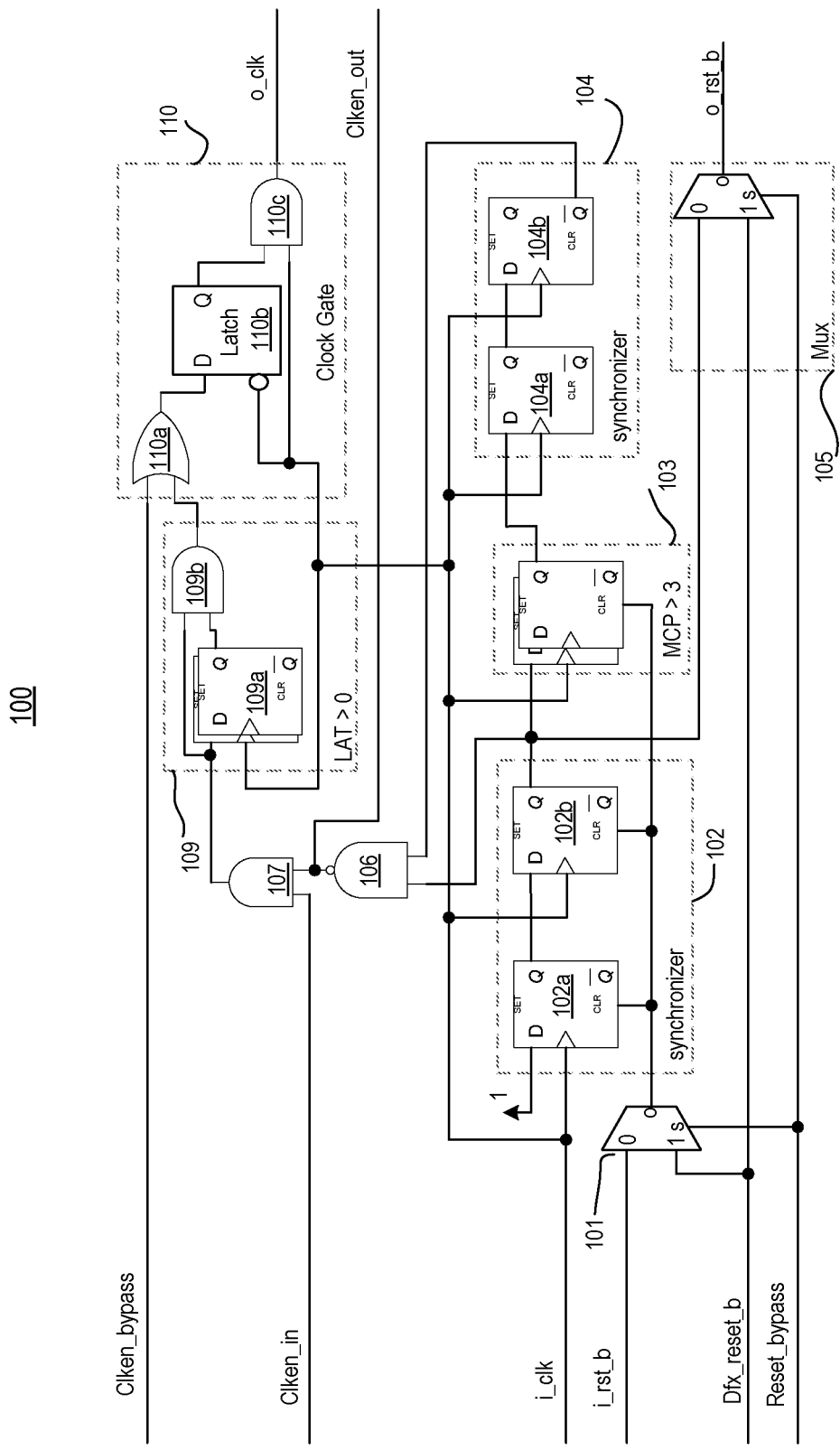
FIG. 1 illustrates an asynchronous reset synchronizer with interlocker, which is double-sync based, in accordance with some embodiments.

One way to correlate reset de-assertion in digital logic with more than one clock-reset pair is to use reset synchronizers that put the reset in the receiving clock domain and then converge timing to a single cycle in that clock domain. These are referred to as single cycle reset synchronizers. However, single-cycle timing across many receivers is very power and timing inefficient and creates congestion in physical design. Multiple synchronized resets are not correlated due to meta-stability uncertainty of the synchronizers. Another way to correlate reset de-assertion is to split the logic into several sub-domains that form appropriate gated clock-reset pairs for multi-cycle timing convergence. These synchronizer circuits are referred to as multi-cycle reset synchronizers. However, splitting logic to uncorrelated clock-reset pairs is costly and not always possible. Synchronizers whose outputs are allowed multiple cycles to distribute to receivers are also subject to meta-stability and are not correlated either. Another way to correlate reset de-assertion is to convert the logic to a single clock-reset paired with a single synchronizer whose output is allowed multiple cycles to reach its receivers. However, logic conversion to a single clock-reset pair is very costly in timing, area, and power aspects.

Some embodiments describe an asynchronous multi-cycle reset synchronization circuit that can correlate any number of resets and synchronous clocks with guaranteed simultaneous reset de-assertion and removal of reset assertion crossing hazards. The asynchronous multi-cycle reset synchronization circuit can also be paired with a synchronous multi-cycle reset synchronization circuit to correlate same domain asynchronous and synchronous resets.

There are many technical effects of the various embodiments. For example, the circuit of various embodiments provides a flexible way to resolve known limitations in multi-reset and multi-clock logic structures. The circuit eliminates costly validation and allows significant power savings. For example, up to 5% leakage savings are observed by various embodiments. The circuit of various embodiments is universal and covers equally all known types of reset synchronization. Other technical effects will be evident from the various figures and embodiments.

One way to correlate synchronous and asynchronous resets in the same circuit is to use single-cycle synchronous reset and single-cycle synchronized asynchronous reset. However, single-cycle synchronous reset is very power and/or timing inefficient and creates congestion in physical design. Multiple single-cycle synchronizers are not correlated due to meta-stability uncertainty. Logic conversion to a single asynchronous clock-reset pair is very costly in timing, area, and power aspects. Some embodiments describe a synchronous reset multi-cycle synchronization circuit that correlates with any number of asynchronous resets and guarantees simultaneous reset de-assertion.

There are many technical effects of the various embodiments. For example, the circuit provides a flexible way to resolve known limitations in logic structures comprising synchronous reset and combined synchronous-asynchronous reset. It eliminates costly validation and allows significant power savings (e.g., up to 5% leakage savings). It is universal and covers equally all known types of synchronous reset. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "single-cycle" refers to two, three or more stages synchronizing circuit especially designed to deliver its output signals to all the connected end points within a single clock cycle.

The term "multi-cycle" generally refers to two, three or more stages synchronizing circuit whose outputs are allowed multiple cycles to reach their connected end points.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

There are two kinds of reset historically used for digital circuits. First, synchronous reset, and second, asynchronous reset.

Synchronous reset (or synchronized reset methodology) normally uses data inputs (D-inputs) of a flip-flop (FF) to erase its value and essentially, it is just a type of data. A synchronous reset network is timed in a single clock for both assertion and de-assertion, like all other data paths. This requires a large number of fast FF cells and results in high leakage, routing congestion, and timing issues.

Asynchronous reset normally uses reset-set inputs (R/S-inputs) of a FF. The assertion is asynchronous. However, de-assertion is synchronized, which may be achieved in two ways. First synchronized reset, and second, untimed reset during gated clock.

Synchronized reset methodology uses the reset de-assertion to meet single clock cycle timing. This is referred to as "single cycle reset synchronization." This technique uses a large number of fast buffers and/or inverters resulting in high leakage, routing congestion, and timing issues. Untimed reset during gated clock takes advantage of clock gating during the reset de-assertion. In the untimed reset approach, reset is not subject to timing and does not cause excess leakage or congestion. This is referred to as "multi-cycle reset synchronization." Various embodiments address known limitations of the asynchronous reset in the untimed reset during gated clock approach. In some embodiments, the aspects of various embodiments are adapted for the synchronized reset approach.

Some designs cannot be easily built or converted to implement a simple single clock, single reset concept. There are a few known anomalies, which make implementation of an asynchronous reset with gated clock troublesome. For example, multiple synchronous clocks with a single reset, a single clock with multiple resets, and duplicate synchronization of the same clock and reset require splitting a single clock and reset domain into multiple sub-domains to form appropriate gated clock-reset pairs. This is a time consuming and bug prone procedure. Furthermore, multiple clock/reset sub-domains require special attention during physical implementation and limit overall performance due to increased on-chip variation. Various embodiments describe a universal circuit that is used to implement reset with gated clock methodology in designs with anomalies.

One solution for multiple clocks or multiple resets schemes is a single-clock synchronized reset approach, which is very poor considering the power and routing resources spent. Converting into a reset with gated clock scheme requires splitting domains to form clear pairs of clock-reset, which is not always possible. Furthermore, some "multiple clocks" designs rely on simultaneous reset de-assertion, which is not achievable with such splitting.

The circuit of various embodiments can connect any number of resets to a single clock domain or any number of synchronous clocks to a single reset. It also allows multiple synchronizers of the same clock-reset pair timed with guaranteed simultaneous reset de-assertion. The circuit of various embodiments is universal and with appropriate tie-offs may be used as a single reset with single gated clock synchronizer.

FIG. 1 illustrates reset synchronizer 100 with interlocker which is double-sync based, in accordance with some embodiments. The circuit cell (i.e., reset synchronizer with interlocker) uses an interlocking mechanism to coordinate between several sources of clock gating. One purpose of this reset synchronizer is to eliminate single clock cycle timing convergence on reset de-assertion.

Reset synchronizer 100 comprises multiplexer 101, first synchronizers 102 double-sync 102), multi-cycle path (MCP) FF 103, second synchronizer 104, multiplexer 105, NAND gate 106, AND gate 107, latency FF (LAT FF) 109, and Clock gate logic 110 coupled as shown. FFs 102a and 102b of first reset synchronizer 102 passes reset to clock gate logic 110 and prevents meta-stability on reset de-assertion. The output of LAF FF 109a coupled to AND gate 109b. Clock gate logic 110 comprises OR gate 110a, latch 110b, and AND gate 110c. The output of AND gate 109b is input to OR gate 110a which also receives the clken_bypass signal. A person skilled in the art would appreciate that logic gates can be replaced with any other logic gate using De Morgan's theorem. While the FFs of various embodiments are illustrated as D-Flip-Flops (or data flip-flops), other implementation of sequential units or circuits can also be used to implement the various FFs described herein.

The signal or pin (or node) names in FIG. 1 are:
clken_bypass—Override clock enable to be on. Clock override is used to bypass the clock from i_clk to o_clk in accordance with some embodiments. For example, clken_bypass is used in scan mode or design-for-test schemes.
clken_in—Input clock enable input for interlocking clock restart after reset deassertion.
i_clk—Input clock signal.
i_rst_b—Asynchronous reset to be synchronized and correlated. This is the primary reset
dfx_reset_b—debug reset that can override the primary reset. This is used for debug or for a design-for-test scheme.
reset_bypass—control signal to allow debug reset to override primary reset via multiplexers 101 and 105.
o_clk—output clock that is gated for multi-cycle reset de-assertion and reset correlation.
clken_out—clock enable signal used for interlocking multiple resets/clocks.
o_rst_b—asynchronous reset output whose de-assertion is synchronized to the clock domain of i_clk.

In some embodiments, apparatus 100 comprises first synchronizer circuit 102 comprising at least two sequential circuits (e.g., 102a and 102b) coupled in series, wherein the first synchronizer circuit 102 is to pass a reset (e.g., i_rst_b) to clock gate 110. Apparatus 100 further comprises second synchronizer circuit 104 comprising at least two sequential circuits (e.g., 104a and 104b), wherein second synchronizer circuit 104 is to substantially eliminate a possible glitch from the reset i_rst_b, and to provide at least two clock cycle relaxation to propagation of de-assertion of the reset. In some embodiments, apparatus 100 comprises a multi-cycle path 103 coupled to an output of the first synchronizer circuit 102, and to an input of the second synchronizer circuit 104, wherein the multi-cycle path 103 is to increase an amount of time to propagate the reset. In some embodiments, the multi-cycle path comprises a flip-flip to align interlocked resets between synchronous clocks of different frequencies.

In some embodiments, a first (e.g., 102a and/or 102b) of the sequential circuits, of the at least two sequential circuits of first synchronizer circuit 102, is to cause assertion of the reset o_rst_b upon assertion of an input reset (i_rst_b). In some embodiments, apparatus 100 comprises NAND gate 106 to prevent a glitch on a clock (e.g., o_clk) when the reset asserts. In some embodiments, the reset propagates through the multi-cycle path 103 and the second synchronizer circuit 104 to change an output of the second synchronizer 104. In some embodiments, apparatus 100 comprises a clock enable pin (clken) that is to remain asserted while the reset is asserted. In some embodiments, first sequential circuit 102a of the first synchronizer circuit, is to assert its output upon de-assertion of the input reset, wherein the asserted output is to cause the NAND gate 106 to behave as an inverter. In some embodiments, apparatus 100 comprises an output clock pin (o_clk), which is to generate a clock for downstream sequential units, wherein the output clock pin is gated while the input reset de-assertion is to propagate through the second synchronizer circuit.

FFs 104a and 104b of second synchronizer 104 serves to eliminate a possible clock glitch from reset and provides at least a two-cycle relaxation to the propagation of reset de-assertion. The 'k' number of series coupled multi-cycle path 103 (MCP FF k) and 'n' number of series LAT FFs (LAT FF n) 109 are optional parts of the circuit, in accordance with some embodiments. Here, series coupled refers to coupling FFs in series where the output of one FF is an input to the next FF, and so on. In one example, 'k' is greater than 3 while 'n' is greater than 0. The MCP k FFs 103 are used to increase the amount of time given to propagation of the reset. In connection with the LAT n FFs 109, the MCP k FFs 103 are also used to align interlocked resets between synchronous clocks of different frequencies.

On reset assertion, the output of FF 102b asserts reset to the downstream circuit through the o_rst_b output (reset bar output). The zero value also propagates to the clken_out (clock enable) NAND gate 106. This NAND gate 106 is already generating a one output due to the output of flip-flop 104b of second synchronizer 104, thus preventing a glitch on the clock when reset asserts. The reset value propagates through MCP FFs k 103 and second synchronizer 104 to change the output of second synchronizer 104 to 1. The clken_out (clock enable) remains 1 while reset is asserted.

On reset de-assertion, the output of FF 102b of first synchronizer 102 becomes one after two to three cycles. This synchronously changes the output (Clken_out) of the clock enable NAND gate 106 to 0, since the other input to NAND gate 106 is also 1. The o_clk output (clock output) is what drives all other sequential circuits (e.g., latches, flip-flops) in the unit or logic domain and is gated by clock gate logic 110 while reset de-assertion propagates to the unit. The reset de-assertion passes to the output of FF 104b of the second synchronizer 104 in 2+k cycles and clken_out becomes 1 again. Through the use of the k MPC FFs 103, clken_in will also become 1 at the same time, enabling the clock. This clock gating is what allows a significant reduction in power and complexity of the downstream reset network.

The various logic gates (e.g., NAND 106, AND 107, OR 110a, etc. and throughout this description) can be replaced with other equivalents. For example, De Morgan's theorem can be used to implement alternative logic gates while preserving the overall function. Such alternatives are within the scope of the various embodiments.

Figure 2:
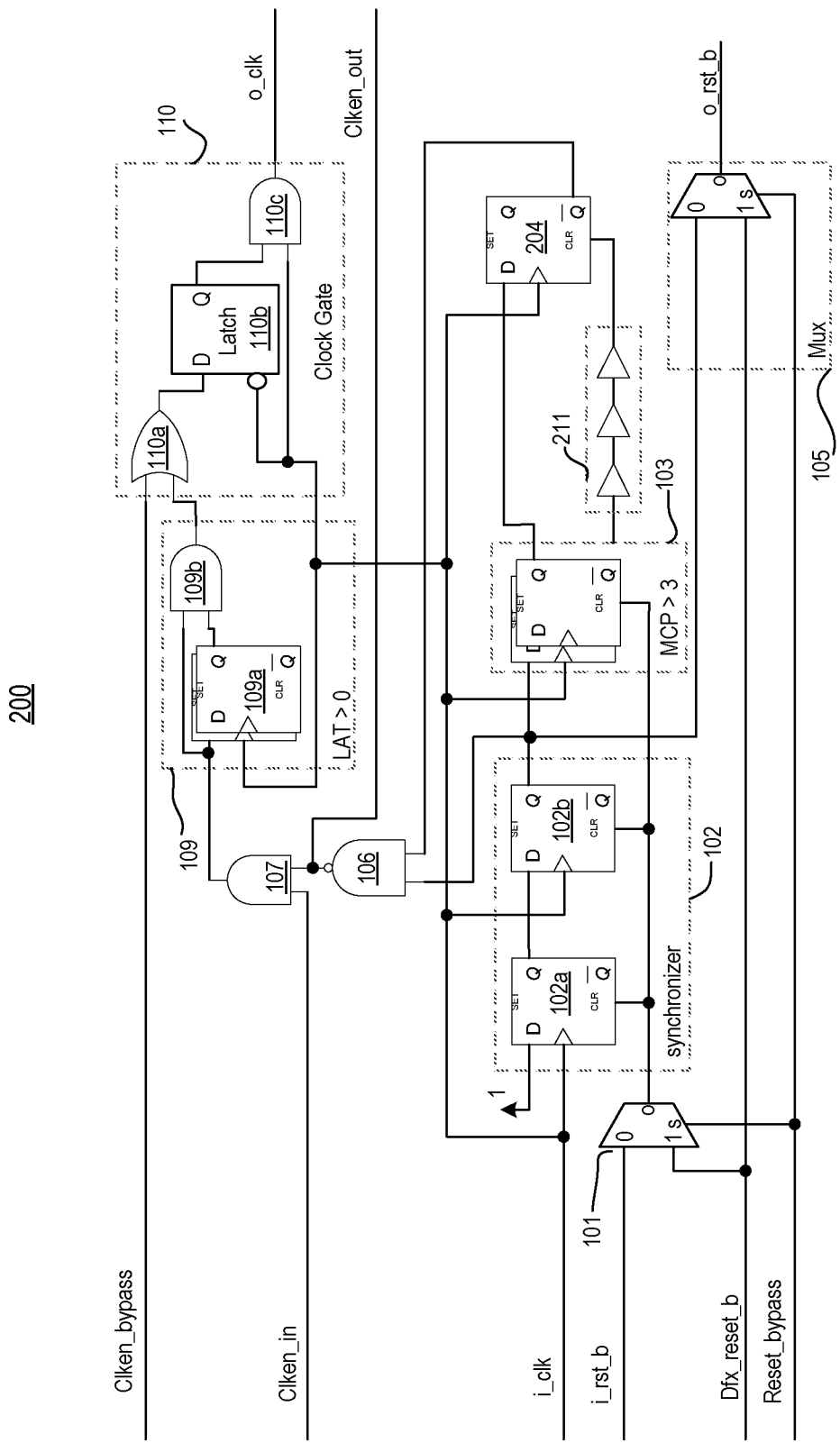
FIG. 2 illustrates an asynchronous reset synchronizer with interlocker, which is double-sync based hardened design, in accordance with some embodiments.

FIG. 2 illustrates reset synchronizer 200 with interlocker, which is double-sync based hardened design, in accordance with some embodiments. Circuit 100 in FIG. 1 is designed to be synthesized as a regular synthesizable logic. However, with a semi-custom (delay-controlled) design, circuit 100 may be slightly simplified as shown in FIG. 2. Assuming the reset synchronizer cell 102 is hardened with the proper timing closure, second synchronizer 104 FIG. 1 can be replaced with a single flip-flop 204 whose reset is driven by a chain of buffers 211 (or at least one buffer) to guarantee that the output clken_out (output clock enable) of NAND 106 never glitches. This change reduces the minimum relaxation given to reset propagation to one clock cycle.

FIG. 1 and FIG. 2 demonstrate the "double-sync" version of the interlocker cell. For a version when higher frequencies require more stages in the synchronizers, the two-flip-flop synchronizers 102 and 104 are replaced with synchronizers of three or more FFs, in accordance with some embodiments.

Figure 3:
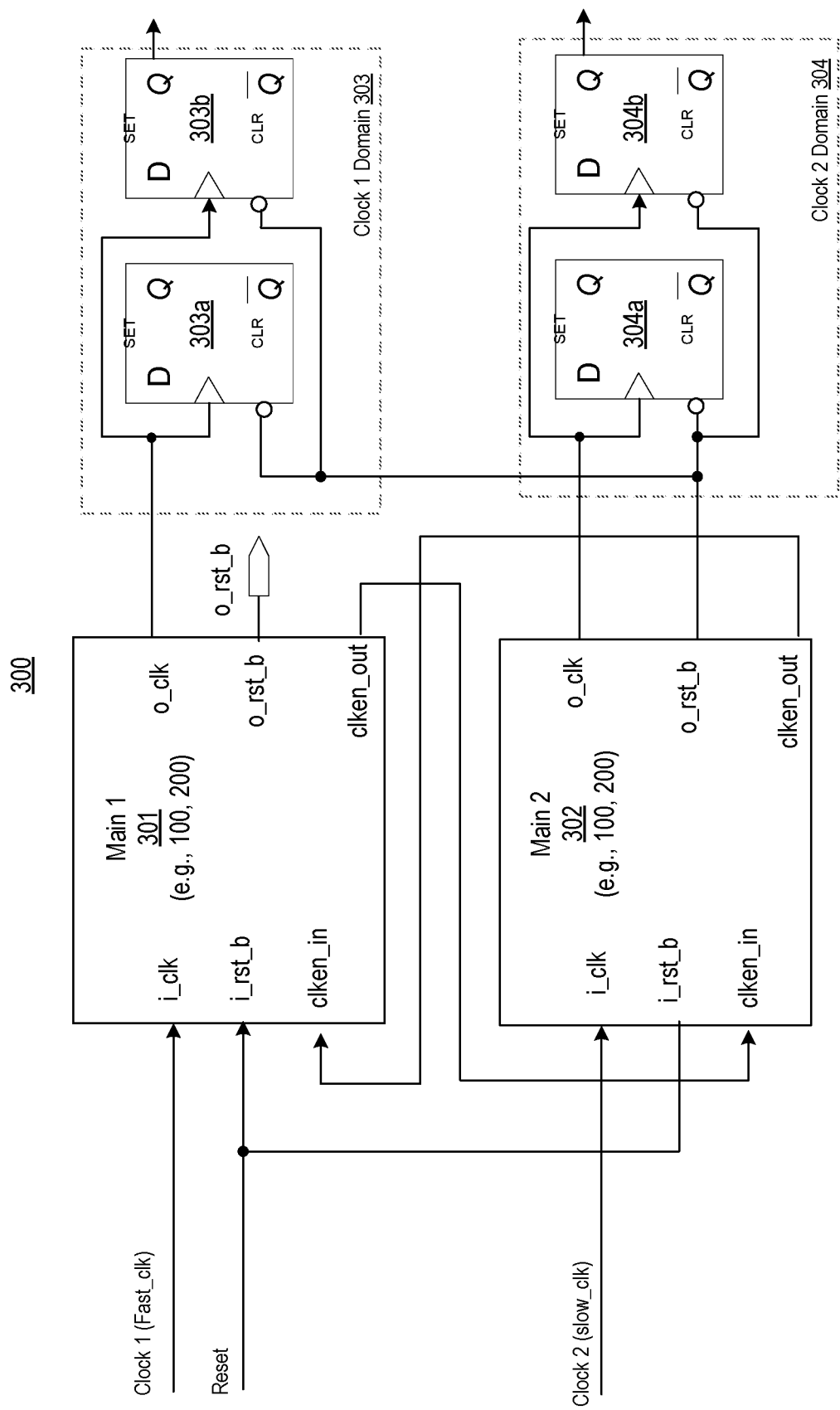
FIG. 3 illustrates a circuit with one asynchronous reset synchronized for multiple clocks, in accordance with some embodiments.

FIG. 3 illustrates circuit 300 with one reset synchronized for multiple clocks, in accordance with some embodiments. Circuit or apparatus 300 comprises first circuitry (Main 1 301) comprising a multi-reset and multi-clock synchronizer; and second circuitry 302 coupled to the first circuitry 301. In some embodiments, first circuitry 301 receives a first clock (Clock 1) having a first frequency, wherein the second circuitry 302 receives a second clock (Clock 2) having a second frequency. In various embodiments, the second frequency is slower than the first frequency. First and second circuitries (301 and 302) receive an input reset (Reset). Second circuitry 302 also comprises a multi-reset and multi-clock synchronizer. In some embodiments, the first circuitry 301 comprises a first synchronizer circuit 102 including at least two sequential circuits (102a and 102b) coupled in series, wherein the first synchronizer circuit is to pass reset to a clock gate 110. In some embodiments, first circuitry 301 comprises second synchronizer circuit 104 including at least two sequential circuits (104a and 104b), wherein the second synchronizer circuit substantially eliminates a possible glitch from the reset, and provides at least two clock cycle relaxation to propagation of de-assertion of the reset.

In some embodiments, second circuitry (Main 2 302) comprises a first synchronizer circuit 102 including at least two sequential circuits (e.g., 102a and 102b) coupled in series, wherein the first synchronizer circuit passes reset to a clock gate. The second circuitry 302 further comprises a second synchronizer circuit 104 including at least two sequential circuits (104a and 104b), wherein the second synchronizer circuit substantially eliminates a possible glitch from the reset and provides at least two clock cycle relaxation to propagation of de-assertion of the reset.

Both circuits Main 1 301 and Main 2 302 receive asynchronous reset (Reset). In this case, a single reset (e.g., from Main 1 301) is used with a family of synchronous clocks. The circuits Main 1 301 and Main 2 302 are one of circuits 100 or 200 of FIG. 1 or FIG. 2. The o_rst_b of Main 1 301 is the fast reset, which is associated with the fast clock Clock 1 (Clk1). The o_rst_b of Main 2 302 is the slow reset, which is associated with the slow clock Clock 2 (Clk2). The frequency of Clk1 is higher than the frequency of Clk2. The clock enable output (clken_out) of Main 1 301 is provided to clock enable input (clken_in) of Main 2 302. The clock enable output (clken_out) of Main 2 302 is provided as clock enable input (clken_in) of Main 1 301. The FFs 303a and 303b of Clock 1 domain 303, and FFs 304a and 304b of Clock 2 domain 304, that receive the output clock (o_clk) and the output reset (o_rst_b) from Main 2 302, are the customers of the synchronization circuitry comprising Main 1 301 and Main 2 302 blocks.

Figure 4:
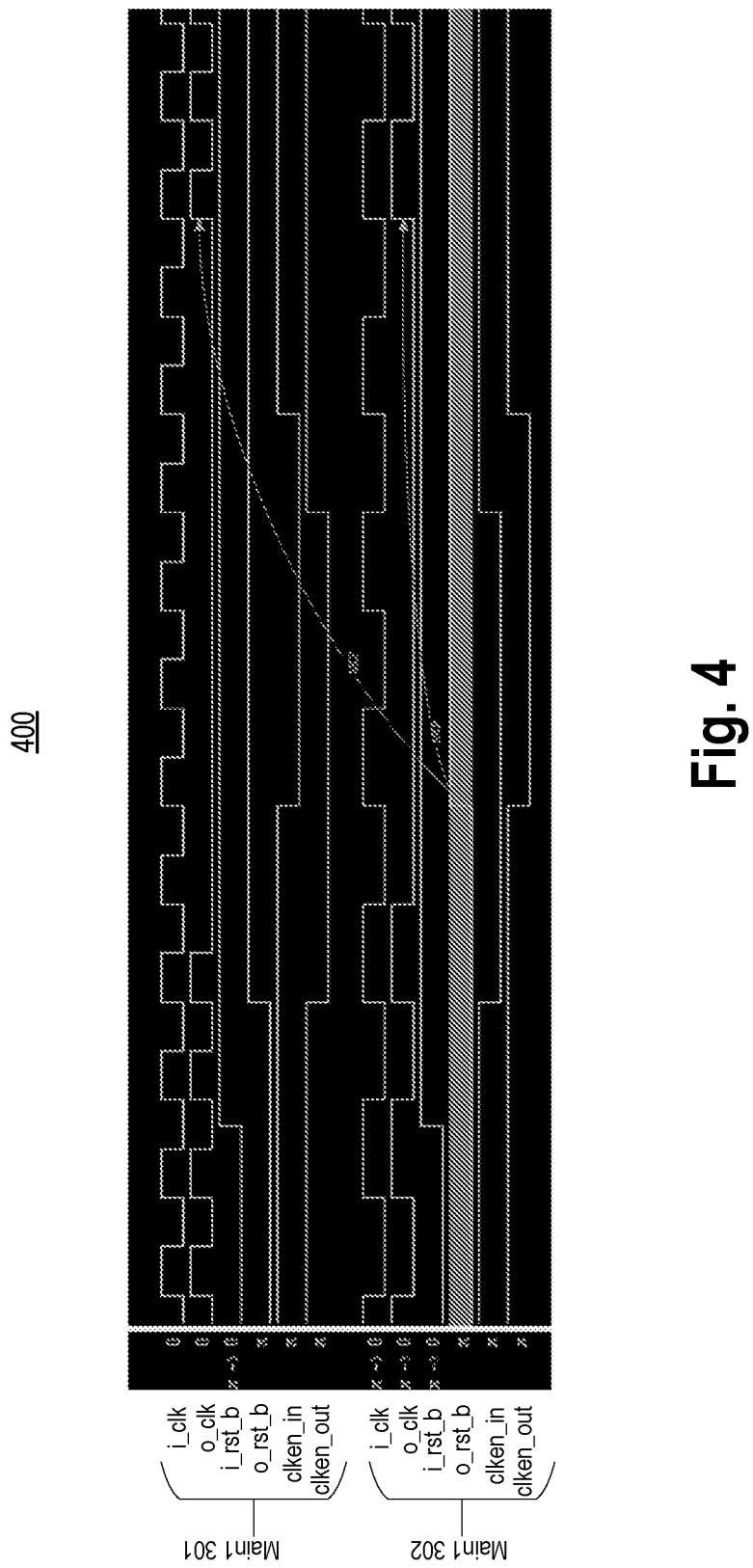
FIG. 4 illustrates application of multi-cycle paths from one asynchronous reset to multiple clocks, in accordance with some embodiments.

FIG. 4 illustrates plot 400 showing waveforms for one reset synchronized for multiple clocks, in accordance with some embodiments. The plot shows that o_rst_b from the Main 2 302 is a multi-cycle path (MCP=3) to both synchronous clock domains. Each synchronizer block (Main 1 301 and Main 2 302) aligns clken_out as follows so the clocks are disabled and re-enabled at the same time.

To align clock gates with synchronizer 100 shown in FIG. 1, the MCP parameter 'k' and LAT parameter 'n' can be set as follows:

To guarantee clken_in/clken_out successful overlapping:
  MCP parameter 'k' of MAIN1 301 is set to (slow_clk_period/fast_clk_period)* 3−1 (e.g., if clocks are 1:2, MCP parameter 'k' is set to 5, for 1:4 clock ratio, MCP is set to 11 etc.).
  LAT parameter 'n' of MAIN1 301 is set to: slow_clk_period/fast_clk_period−1 (e.g., if clocks are 1:2, LAT parameter 'n' is set to 1, for 1:4 clock ratio, LAT parameter is set to 3 etc.).
  LAT and MCP parameters ('n' and 'k', respectively) of MAIN2 302 are kept to their defaults: n=0, k=3.

To align clock gates with synchronizer 200 shown in FIG. 2, the MCP parameter 'k' and LAT parameter 'n' can be set as follows:

To guarantee clken_in/clken_out successful overlapping:
  MCP parameter 'k' of MAIN1 301 is set to:
(slow_clk_period/fast_clk_period)−1 (e.g., if clocks are 1:2, MCP parameter 'k' is set to 1, for 1:4 clock ratio, MCP parameter 'k' is set to 3 etc.).
  LAT parameter 'n' of MAIN1 301 is set to: slow_clk_period/fast_clk_period−1 (e.g., if clocks are 1:2, LAT parameter 'n' is set to 1, for 1:4 clock ratio, LAT parameter 'n' is set to 3 etc.). Typically, MAIN2 LAT and MCP parameters ('n' and 'k' respectively) are kept to their defaults n=0, k=2.

Figure 5:
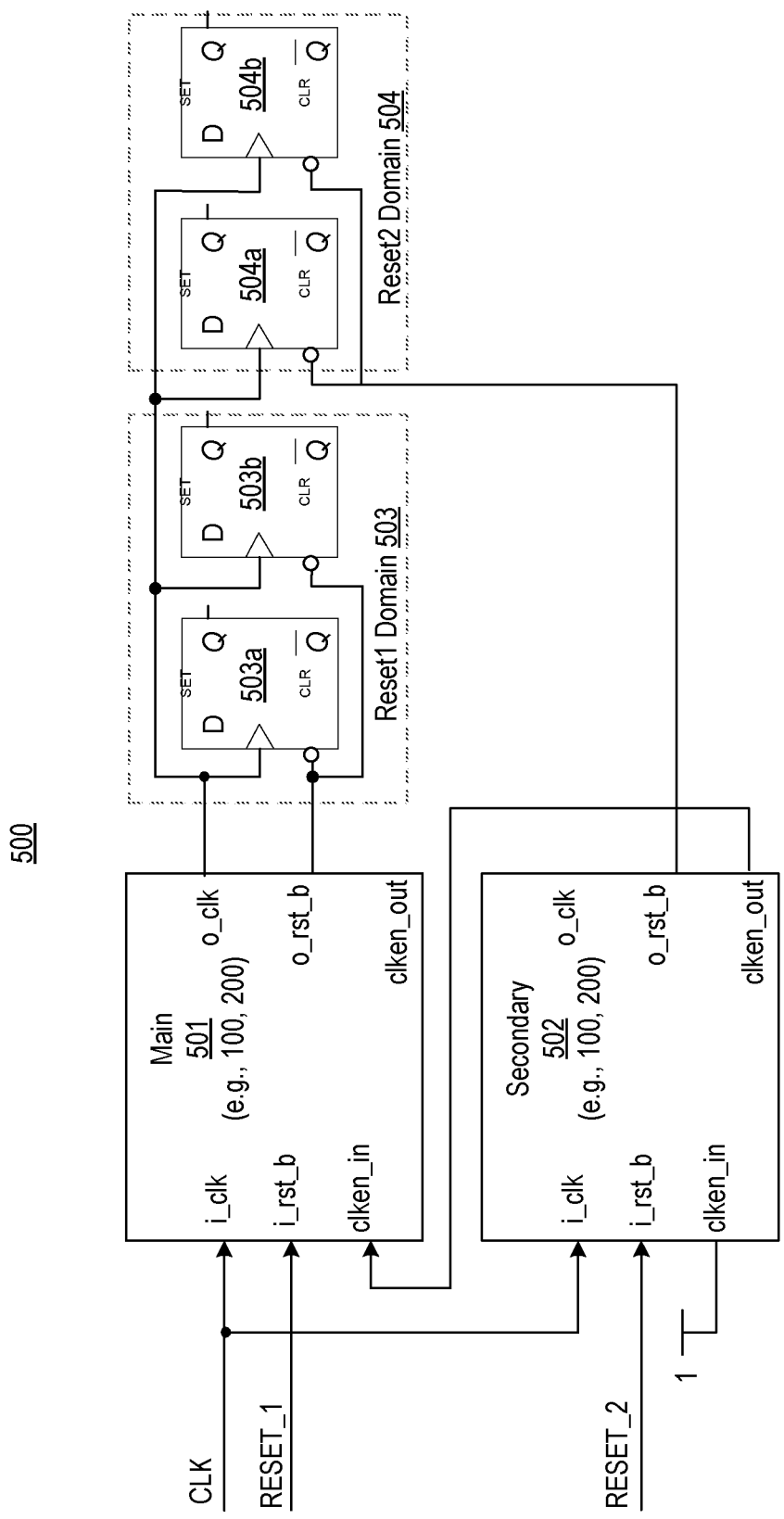
FIG. 5 illustrates a circuit with multiple asynchronous resets synchronized in a single clock domain, in accordance with some embodiments.

FIG. 5 illustrates circuit 500 with multiple reset synchronized in a single clock domain, in accordance with some embodiments. Here, instead of slow and fast clocks, a single clock CLK is used with two resets (Reset 1 and Reset 2). The blocks Main 501 and Secondary 502 are according to one of FIG. 1 or FIG. 2. The connections of the pins show resetting two different reset domains—Reset 1 domain 503 and Reset 2 domain 504. In this example, reset 1 domain 503 shows two FFs 503a and 503b while reset 2 domain shows two FFs 504a and 504b that receive output clock o_clk. The FFs of reset 1 domain 503 are reset by o_rst_b of Main 501 while FFs of reset 2 domain 503 are reset by o_rst_b of Secondary 502. Here, the clock enable output (clken_out) of Secondary 502 is provided to clock enable input (clken_in) of Main 501. The clock enable input (clken_in) of Secondary 502 always enabled (e.g., by connection to a supply node or a node driving a high).

Figure 6:
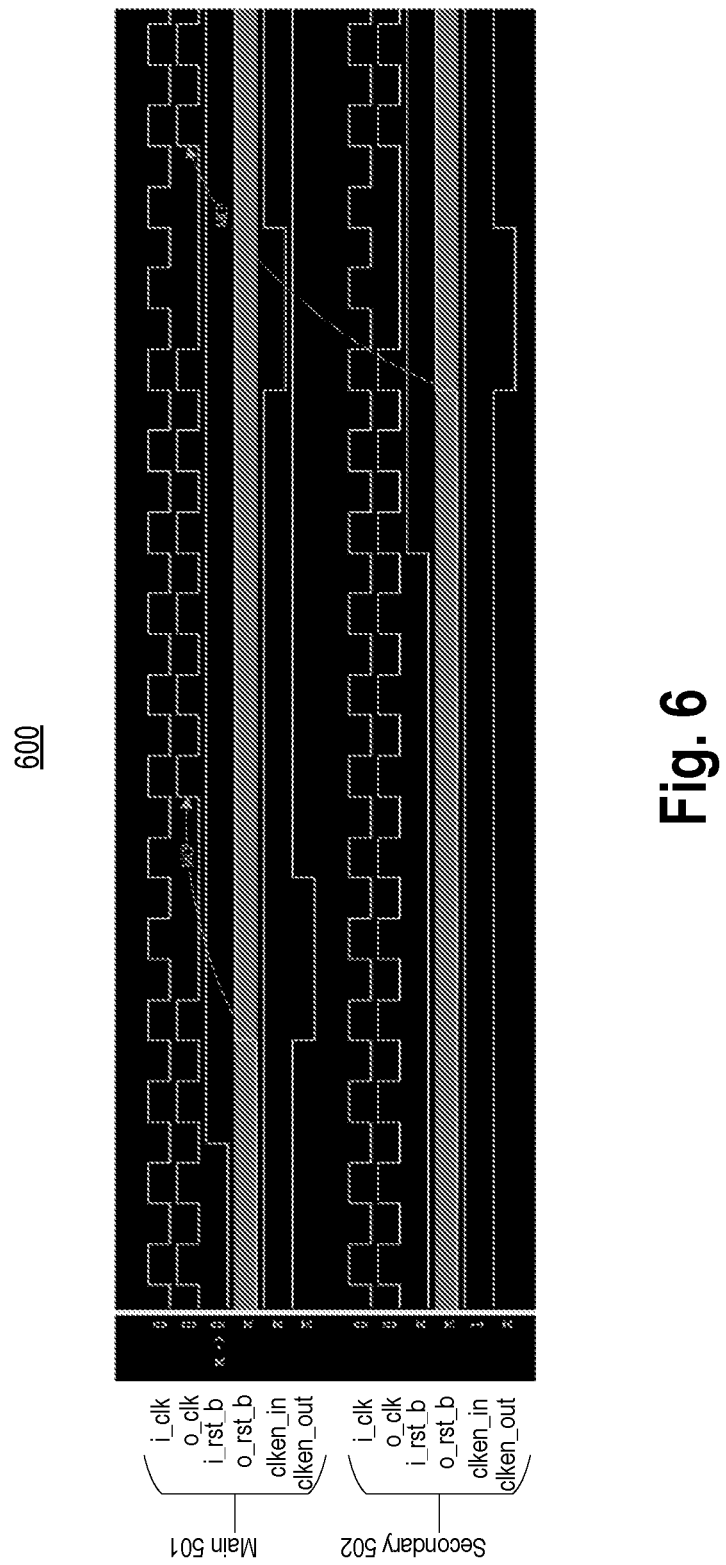
FIG. 6 illustrates a plot showing application of multi-cycle paths from two asynchronous resets to a single clock, in accordance with some embodiments.

FIG. 6 illustrates plot 600 showing application of multi-cycle paths from two resets to a single clock using circuit 500 of FIG. 5, in accordance with some embodiments.

Figure 7:
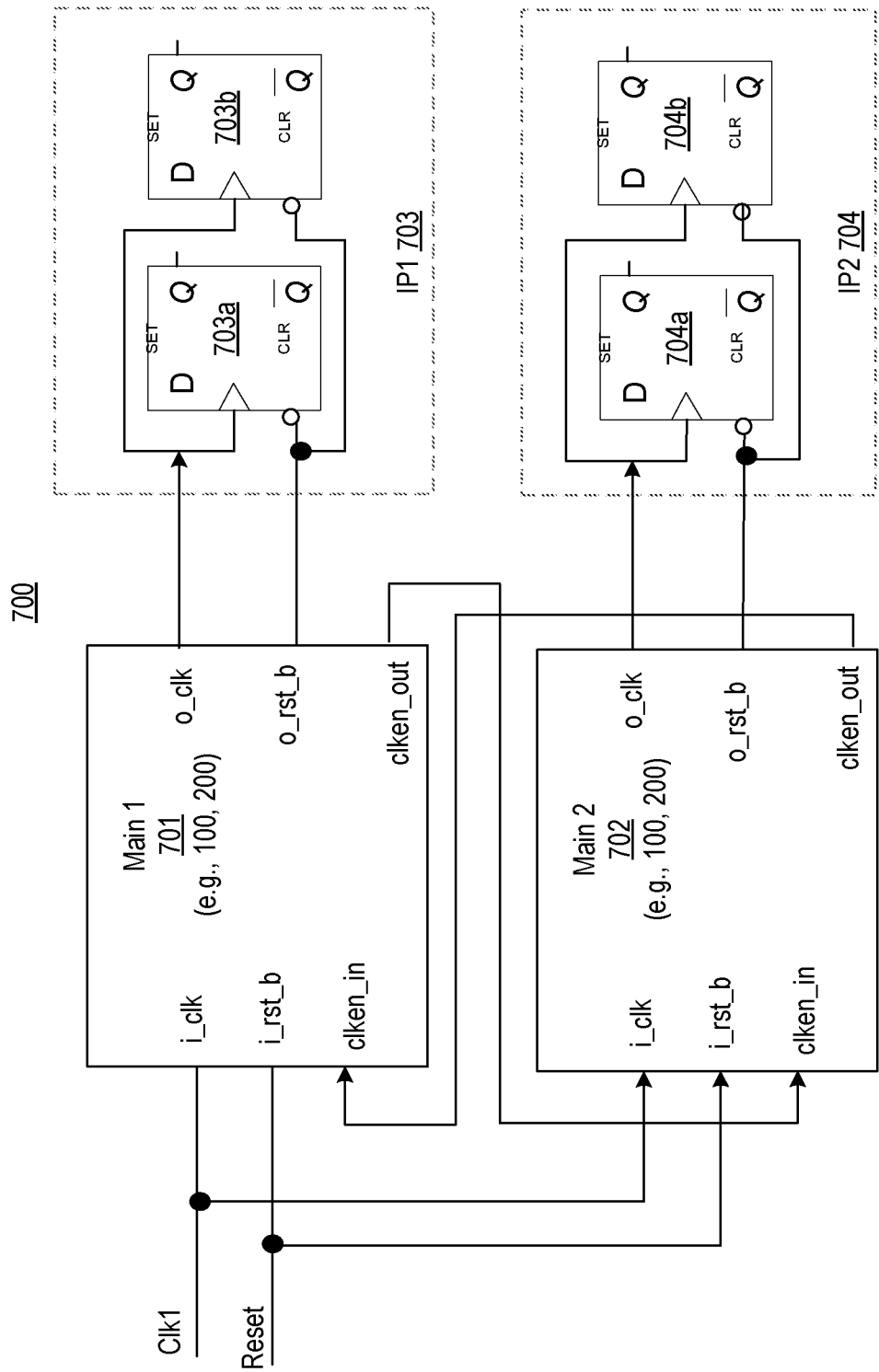
FIG. 7 illustrates an interlocked scheme that removes re-convergence hazard, in accordance with some embodiments.

FIG. 7 illustrates an interlocked scheme 700 that removes re-convergence hazard, in accordance with some embodiments. Scheme 700 is a duplicate synchronization of single clock and single reset. Sometimes, the same reset and clock are synchronized by several intellectual property (IP) blocks separately. The blocks Main 701 and Main 702 are according to one of FIG. 1 or FIG. 2. Both blocks receive the same clock Clk1 and asynchronous reset. The clock enable output (clken_out) of Main 1 701 is provided to clock enable input (clken_in) of Main 2 702. The clock enable output (clken_out) of Main 2 702 is provided as clock enable input (clken_in) of Main 1 701. Main 1 701 provides the output clock (o_clk) to FFs of IP1 703. In this example, IP1 703 is illustrated with two flip-flops 703a and 703b that receive clock output o_clk and reset output o_rst_b from Main 1 701. However, IP1 703 can have any number of flip-flops. Main 2 702 provides the output clock (o_clk) to FFs of IP2 704. In this example, IP2 704 is illustrated with two flip-flops 704a and 704b that receive clock output o_clk and reset output o_rst_b from Main 2 702. However, IP2 704 can have any number of flip-flops.

Though this design practice is subject to reset re-convergence hazards, it still may be found in some legacy IPs. The synchronization cell of various embodiments can help to resolve the hazard ultimately without changing internal IP finite state machines (FSMs).

Figure 8:
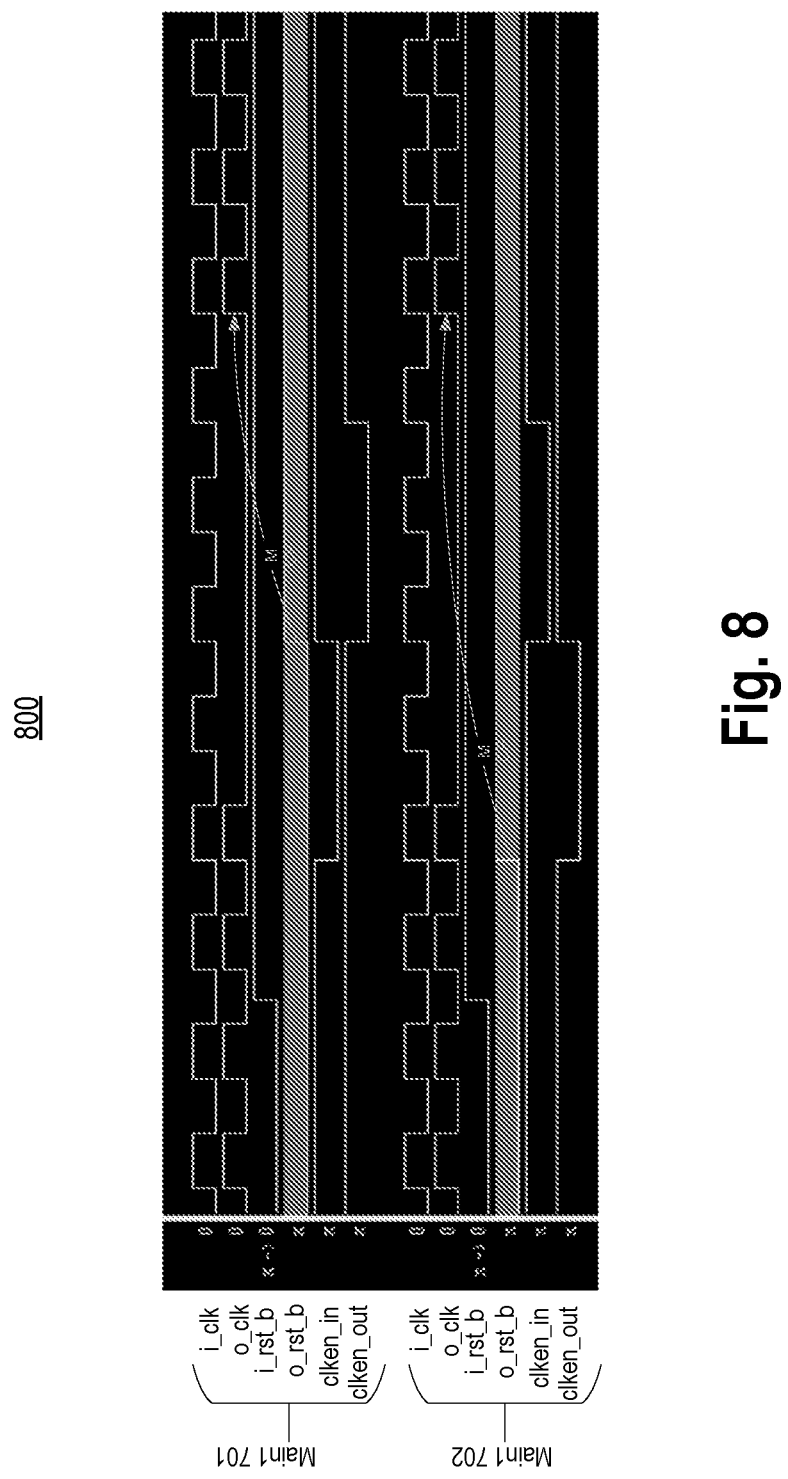
FIG. 8 illustrates a plot showing simultaneous reset exit, in accordance with some embodiments.

FIG. 8 illustrates plot 800 showing simultaneous reset exit, in accordance with some embodiments. The scheme of FIG. 7 allows for both Main 1 and Main 2 blocks (701 and 702, respectively) to exit reset simultaneously, despite the asynchronous sampling ambiguity. Plot 800 of FIG. 8 shows duplicate synchronization of a single clock (single reset synchronization waveform).

Figure 9:
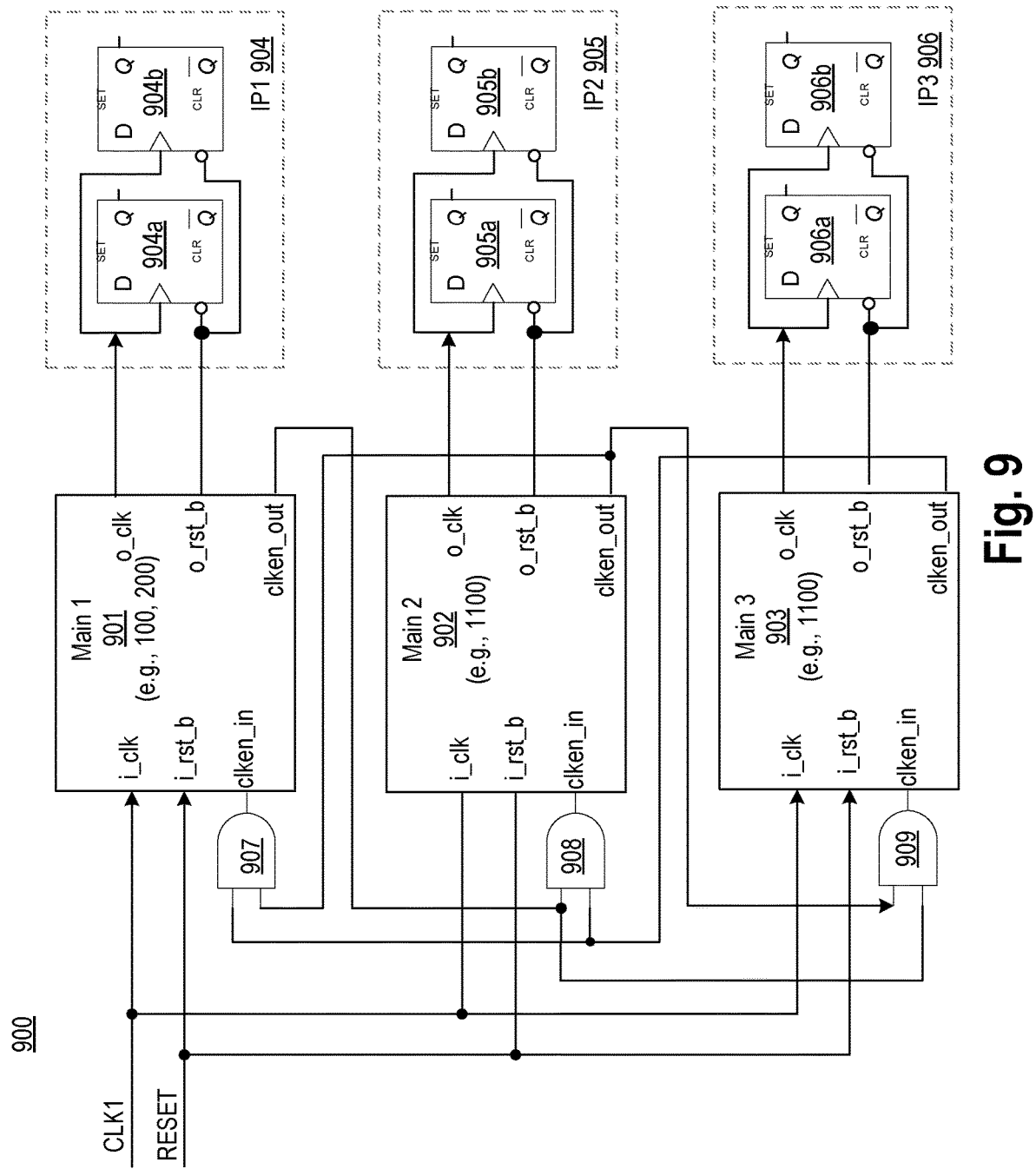
FIG. 9 illustrates an extended scheme that removes re-convergence hazard, in accordance with some embodiments.

FIG. 9 illustrates an interlocked scheme 900 that removes re-convergence hazard, in accordance with some embodiments. The synchronization scheme of various embodiments can be extended to any number of synchronous clock and resets. FIG. 9 illustrates a case with single clock Clk1 and reset using three Main blocks 901, 902, and 903. The blocks Main 901, Main 902, and Main 903 are according to one of FIG. 1 or FIG. 2. FIG. 9 is an extension of the scheme of FIG. 7.

The clock enable output (clken_out) of Main 1 901 is provided to clock enable input (clken_in) of Main 2 902 via AND gate 908. The clock enable output (clken_out) of Main 2 702 is provided as clock enable input (clken_in) of Main 1 901 via AND gate 907. The clock enable output (clken_out) of Main 2 902 is also provided as clock enable input (clken_in) of Main 3 903 via AND gate 909. The clock enable output (clken_out) of Main 1 901 is also provided as clock enable input (clken_in) of Main 3 903 via AND gate 909. AND gate 907 also receives clken_out from Main 3 903.

Main 1 901 provides the output clock (o_clk) to FFs of IP1 904. In this example, IP1 (first intellectual property block) 904 is illustrated with two flip-flops 904a and 904b that receive clock output o_clk and reset output o_rst_b from Main 1 901. However, IP1 904 can have any number of flip-flops. Main 2 902 provides the output clock (o_clk) to FFs of IP2 905. In this example, IP2 (second intellectual property block) 905 is illustrated with two flip-flops 905a and 905b that receive clock output o_clk and reset output o_rst_b from Main 2 902. However, IP2 905 can have any number of flip-flops. Main 3 903 provides the output clock (o_clk) to FFs of IP3 906. In this example, IP3 906 is illustrated with two flip-flops 906a and 906b that receive clock output o_clk and reset output o_rst_b from Main 3 903. However, IP3 906 can have any number of flip-flops.

Figure 10:
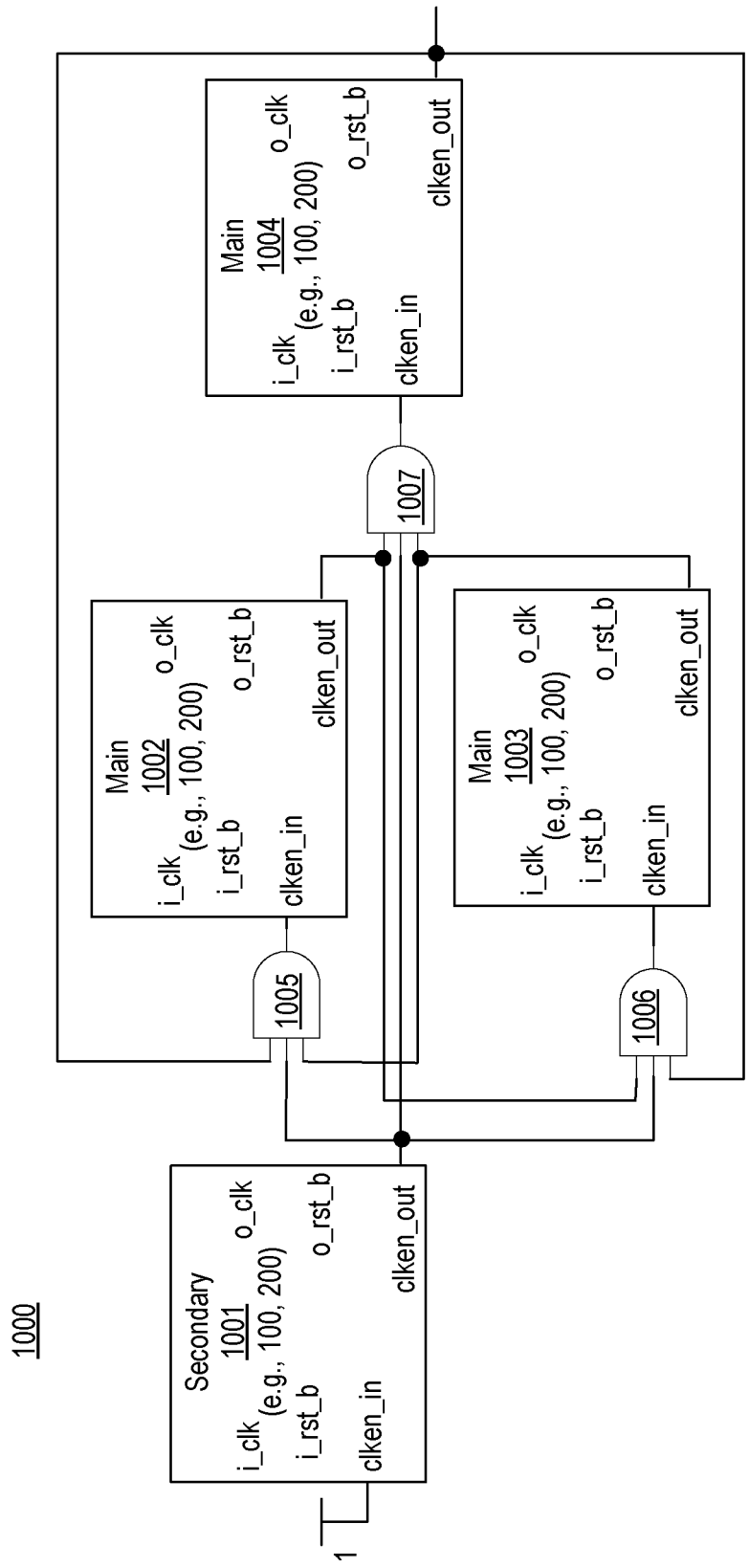
FIG. 10 illustrates a scheme to correlate any number of synchronous clocks and/or resets by an AND logic function, in accordance with some embodiments.

FIG. 10 illustrates scheme 1000 to extend any number of synchronous clocks and/or resets by an AND logic function, in accordance with some embodiments. The synchronization cell functionality may be extended to any number of synchronous clocks/resets by a simple AND gate. Scheme 1000 illustrates blocks Secondary 1001, Main 1002, Main 1003, and Main 1004 that according to one of cells of FIG. 1 or FIG. 2. Clock enable output (clken_out) of Secondary 1001 is received as input by AND gates 1004, 1005, and 1006. Other two inputs of AND gates 1005, 1006, and 1007 are the clock enable outputs from Main 1002, Main 1003, and/or Main 1004 as shown. The outputs of AND gates 1005, 1006, and 1007 are received as clock enable input signals. For example, the output of AND 1005 is the clock enable input of Main 1002, the output of AND 1006 is the clock enable input of Main 1003, and the output of AND 1007 is the clock enable input of Main 1004.

In some embodiments, to correlate same domain, asynchronous and synchronous resets of the proposed cell(s) can be paired with a synchronous multi-cycle reset synchronization circuit. In some embodiments, synchronous reset multi-cycle synchronization circuit is described that correlates with any number of asynchronous resets and guarantees simultaneous reset de-assertion.

Figure 11:
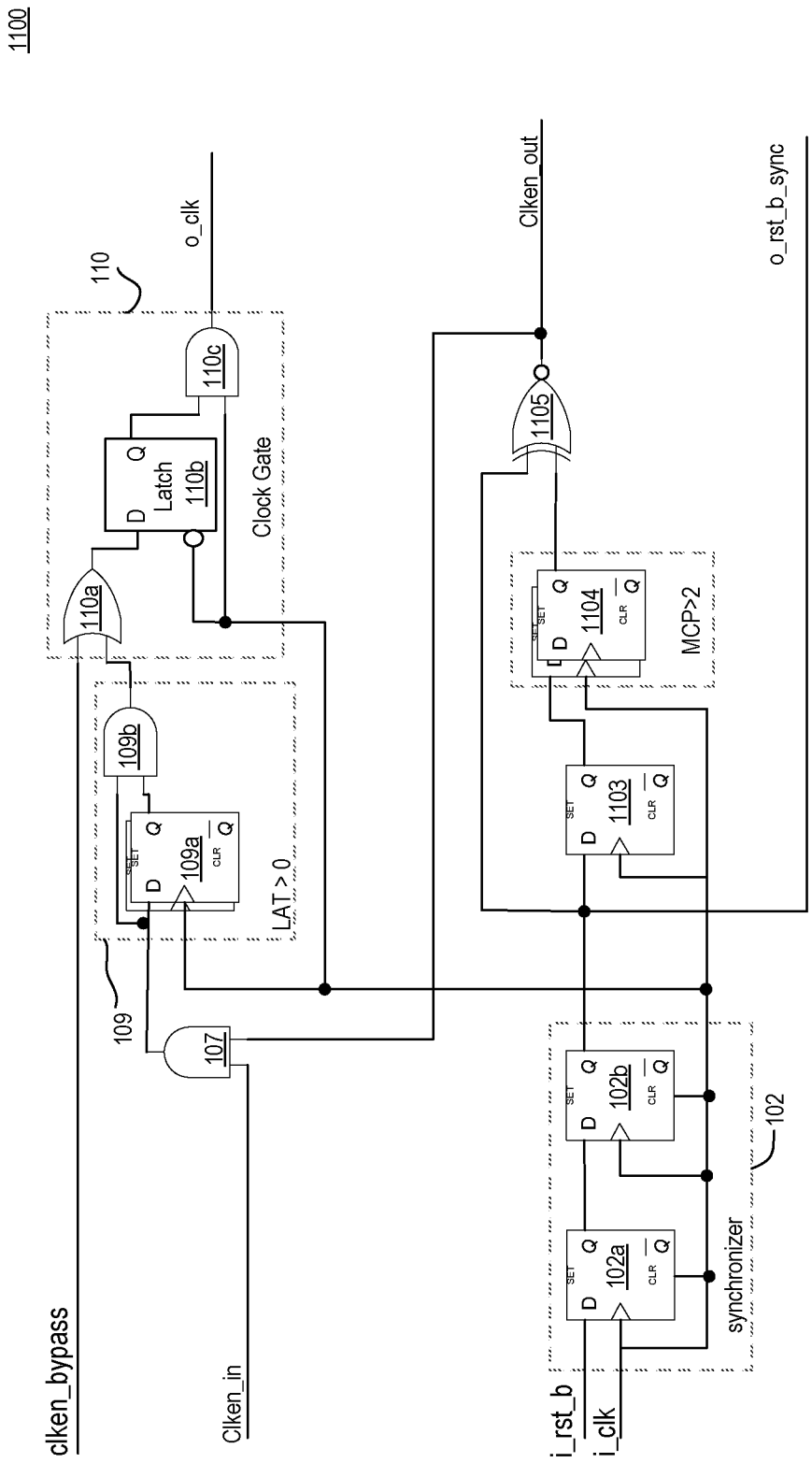
FIG. 11 illustrates a synchronous reset synchronizer with interlocker, which is double-sync based, in accordance with some embodiments.

FIG. 11 illustrates an interlocking mechanism 1100 to coordinate between several sources of clock gating, in accordance with some embodiments. Interlocking mechanism 1100 comprises synchronizer 102, flip-flop 1103, MCP FF 1104, XNOR gate 1105, AND gate 107, LAT FF 109, and clock gate 110 coupled as shown. The various signals (or pins) are listed as:

clken_bypass—Override clock enable to be on
clken_in—Input clock enable input for interlocking clock restart after reset de-assertion
i_clk—Input clock signal
i_rst_b—Input synchronous reset to be correlated
o_clk—output clock that has been gated for multi-cycle reset de-assertion and reset correlation
clken_out—clock enable signal used for interlocking multiple resets/clocks
o_rst_b_sync—Synchronous reset output.

Interlocking mechanism 1100 shows the "double-sync" version of the interlocker cell. For a version to resolve meta-stability with higher clock frequencies, the two-flop synchronizer is replaced with a three, four, or more flop synchronizer. One of the functions of this circuit is to gate the clock with every i_rst_b change (e.g., either 0→1 or 1→0). The first double-sync 102 resolves the meta-stability hazard from a cross-clock reset. If i_rst_b is already synchronous to i_clk, this synchronizer may be removed. Flip-flop 1103 provides a minimum delay for gating the clock on reset change. The LAT FFs 109 and MCP FFs 1104 are optional parts of Interlocking mechanism 1100. MCP FFs 1104 on the clken path provide more cycles for reset propagation if desired after a reset change. LAT FFs 109 allow for matching of delays between synchronous clocks of different frequencies.

The operation of interlocking mechanism 1100 (or Interlocking circuit 1100) is as follows: On reset assertion or de-assertion, synchronizer 102 cleans up the meta-stability hazard from a cross-clock reset signal. The output of FF 1103 flips the clken_out output of the XNOR (exclusive NOR) 1105 to 0. K+1 cycles later (e.g., by k MCP FFs 1104), the other input of XNOR 1105 flips to match the new reset value and the clken_out signal changes back to 1. The clock is gated in concert with the clken_in signal to interlock multiple resets together for simultaneous reset propagation. Clock gating can be shifted by N cycles with the optional 'n' LAT FFs 109a to match frequencies between different synchronous clocks. The input reset signal is held at its new value for a minimum of 3+k+n cycles in order for that value to be clocked into the downstream sequential units.

Figure 12:
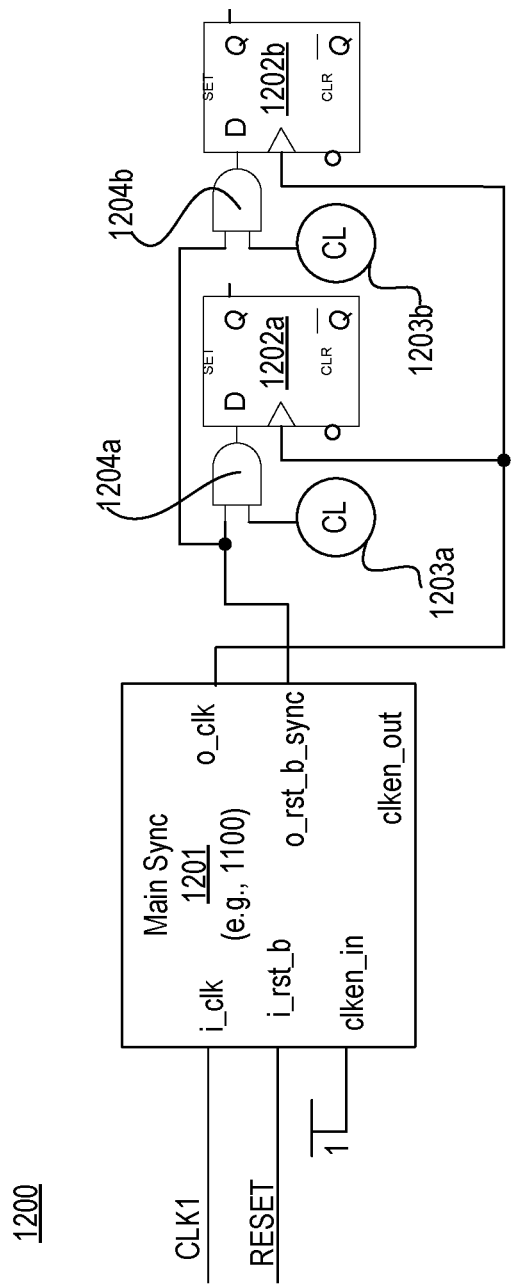
FIG. 12 illustrates s synchronous reset circuit, in accordance with some embodiments.

FIG. 12 illustrates synchronous reset circuit 1200, in accordance with some embodiments. Here, Main Sync block 1201 contains the circuitry of FIG. 11. Output clock (o_clk) is used as the sampling clock for flip-flops or sequential units 1202a and 1202b. The synchronous reset (o_rst_b_sync) overwrites the output of combinational logic 1203a and 1203b by using AND gates (e.g., 1204a and 1204b).

Figure 13:
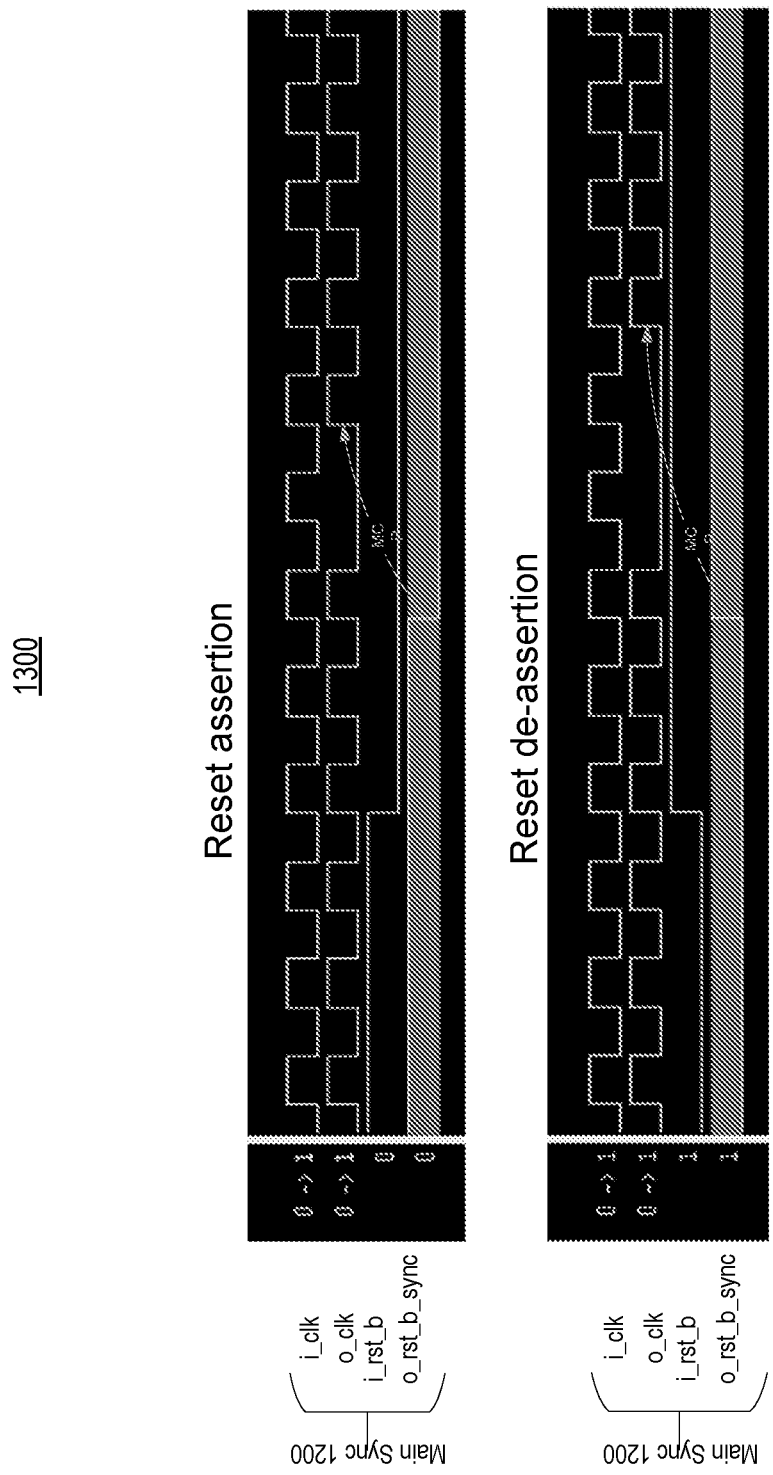
FIG. 13 illustrates a plot showing operation of the synchronous reset circuit, in accordance with some embodiments.

FIG. 13 illustrates a set of plots 1300 showing operation of the synchronous reset circuit 1200 during reset assertion and de-assertion, in accordance with some embodiments. FIG. 12 and FIG. 13 illustrates synchronous reset circuit used stand alone.

Figure 14:
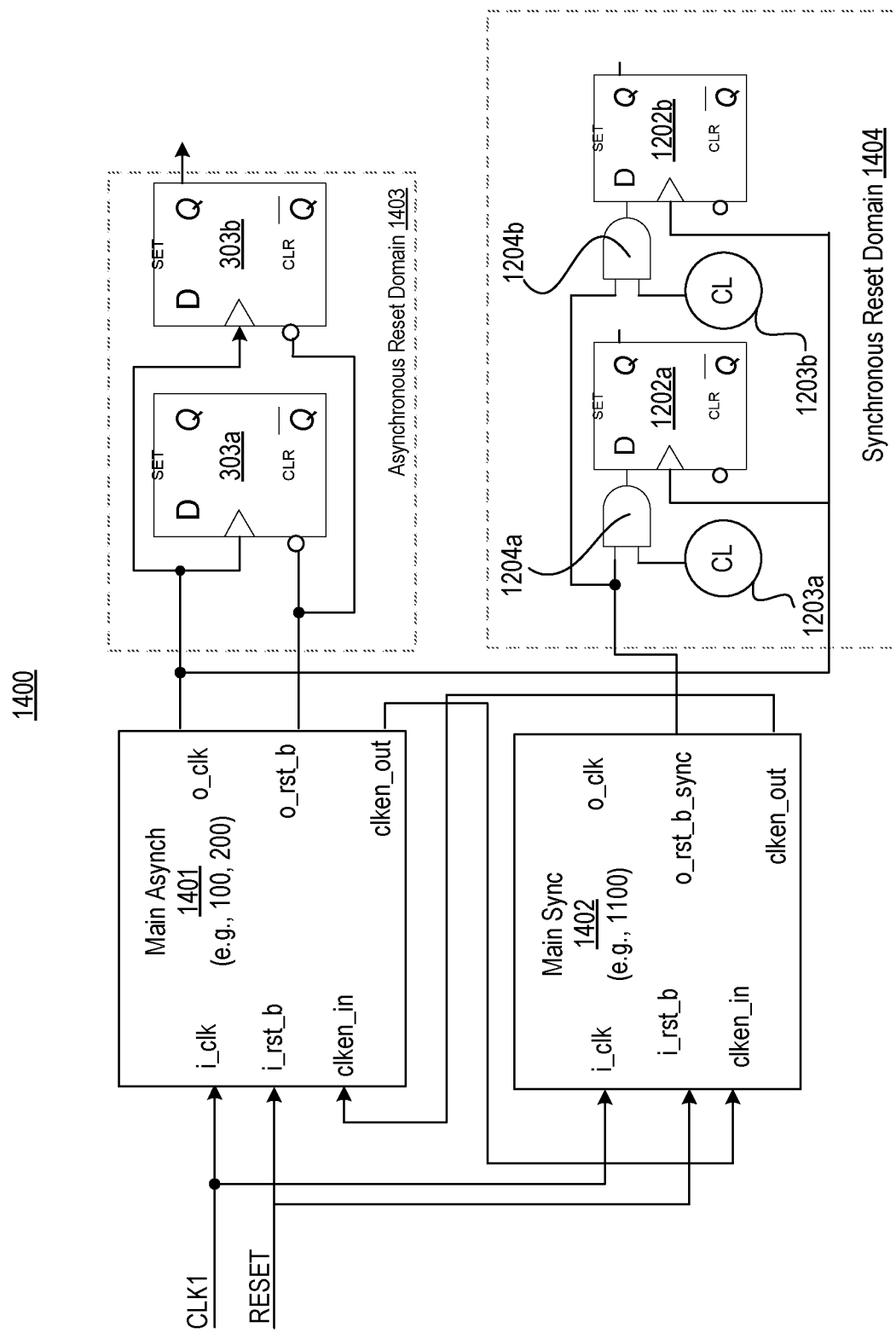
FIG. 14 illustrates a synchronous reset circuit interlocked with an asynchronous reset synchronizer, in accordance with some embodiments.

FIG. 14 illustrates circuit 1400 with synchronous reset circuit interlocked with an asynchronous reset synchronizer, in accordance with some embodiments. Circuit 1400 comprises main asynchronous block 1401 (e.g., one of the circuits of FIG. 1 or FIG. 2) and a main synchronous block 1402 (e.g., circuit of FIG. 11). The clock enable output (clken_out) from Main Sync block 1402 is received as clock enable input (clken_in) by Main Asynch 1401. The clock enable output (clken_out) from Main Asynch 1401 is received as clock enable input (clken_in) of Main Sync 1402. The output reset (o_rst_b) from Main Asynch 1401 is used to reset the Asynchronous Reset Domain 1403. The output clock (o_clk) from Main Asynch 1401 is used to provide clock to the Asynchronous Reset Domain 1403. In this example, two FFs 303a and 303b are shown in the Asynchronous Reset Domain 1403. However, any number of sequential (FFs and/or latches) can be present in Asynchronous Reset Domain 1403. The synchronous reset (o_rst_b_sync) from Main Sync 1402 is used to reset the Synchronous Reset Domain 1404 (e.g., FFs 1202 and 1202b). Any number of sequential (FFs and/or latches) can be present in Asynchronous Reset Domain 1403.

Figure 15:
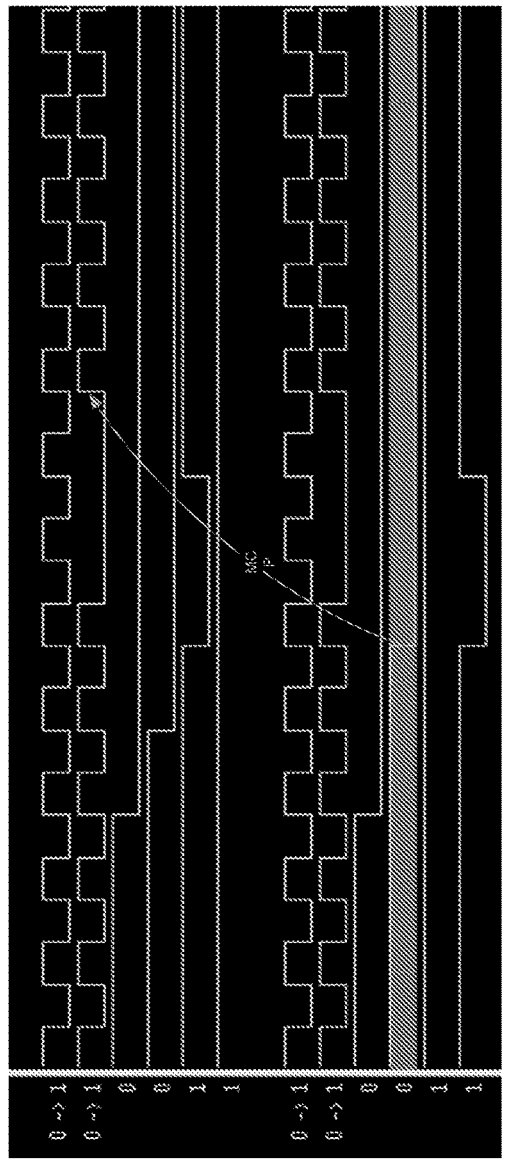
FIG. 15 illustrates plots showing interlocking synchronous and asynchronous reset waveforms, in accordance with some embodiments.
Figure 15:
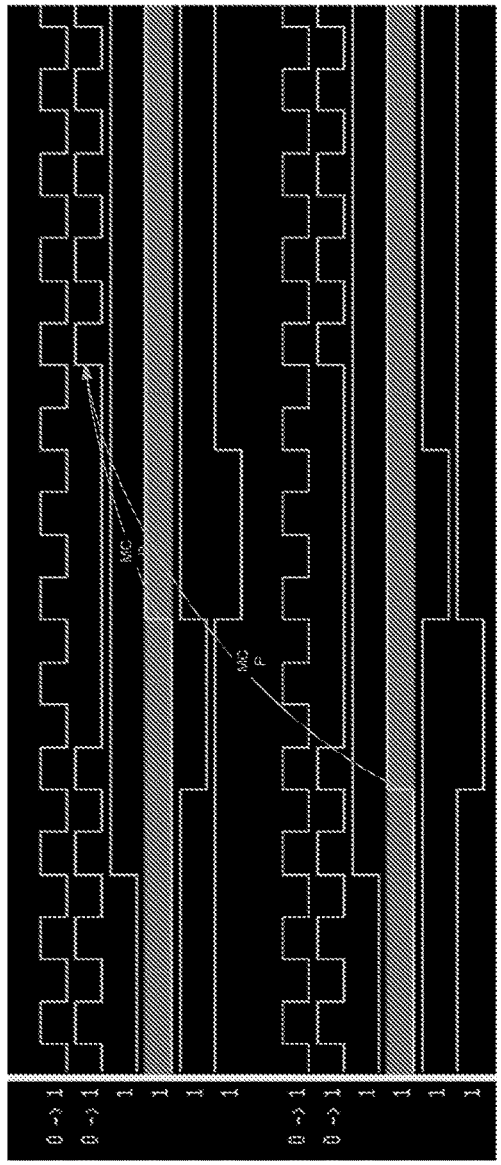

FIG. 15 illustrates a set of plots 1500 showing interlocking synchronous and asynchronous reset waveforms, in accordance with some embodiments. Often, the same reset is used in both asynchronous (synchronized de-assertion) and synchronous (D-input) schemes. To guarantee clken_in/clken_out successful overlapping both Main Sync and Main Async MCP parameters should match (both shown as MCP=3 on FIG. 15. Note, synchronizer, clock_gate 110 and MUX (101 and 105) are standard cells that are used for example only. The proposed circuits may be built using any typical reset synchronizer, clock gate and multiplexer.

Figure 16:
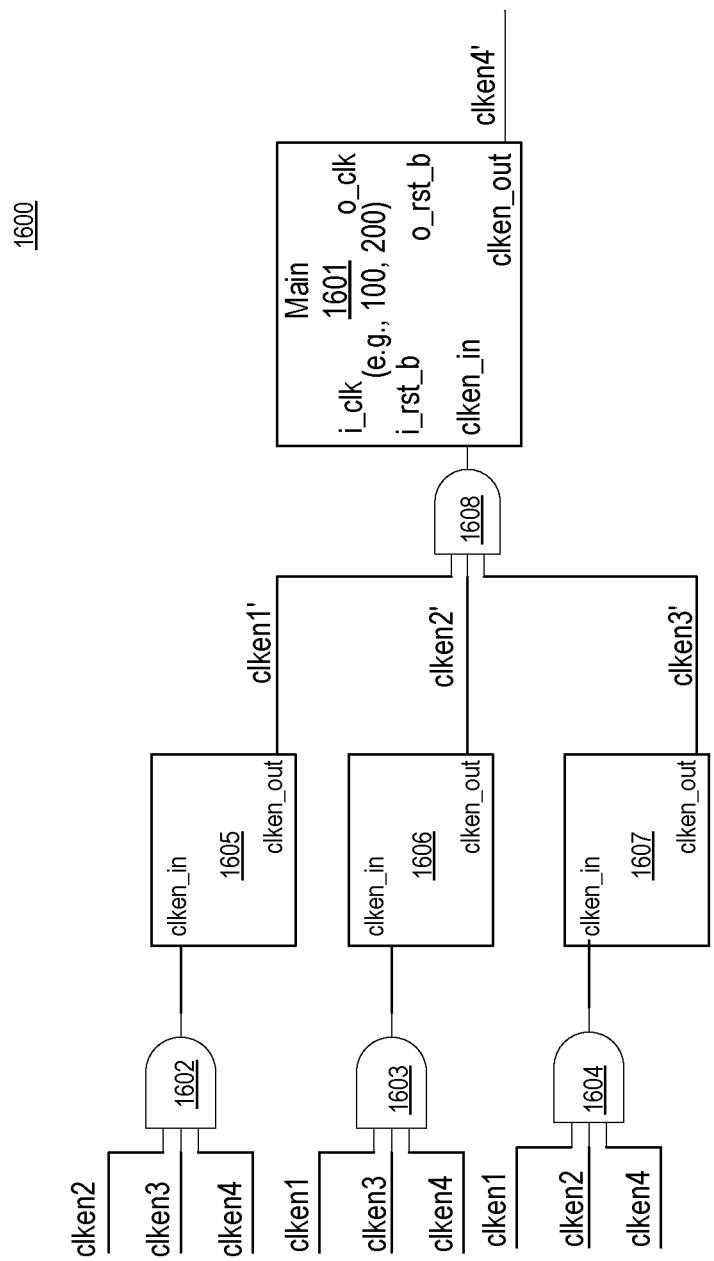
FIG. 16 illustrates a mechanism for extending the interlocking scheme with an AND logic function, in accordance with some embodiments.

FIG. 16 illustrates mechanism 1600 for extending the interlocking scheme with an AND logic function, in accordance with some embodiments. In this example, four 3-input AND gates are shown 1602, 1603, 1604, and 1608 that AND the various clock enable signals (e.g., clken1, clken2, clken3, and clken4). For example, AND 1602 performs an AND operation on clken2, clken3, and clken4. The output of AND 1602 is provided to cell 1605 (e.g., one of the cells of FIG. 1, 2, or 11) to generate clken1'. AND 1603 performs an AND operation on clken1, clken3, and clken4. The output of AND 1603 is provided to cell 1606 (e.g., one of the cells of FIG. 1, 2, or 11) to generate clken2'. The output of AND 1604 is provided to cell 1607 (e.g., one of the cells of FIG. 1, 2, or 11) to generate clken3'. The clock enables (clken1', clken2', and clken3') are ANDed by AND logic gate 1608. The output of AND 1608 is received as clock enable input of Main 1601 (e.g., one of the cells of FIG. 1, 2, or 11) to generate clock enable clken4'. The cell functionality may be extended to any number of synchronous clocks/resets by a simple AND gate.

A person skilled in the art would appreciate that the flip-flops here can be replaced with any suitable sequential unit (e.g., edge triggered D-flip-flop, flip-flop with scan gadget for debug and testing, latch, etc.). The XNOR gates can be replaced with any suitable comparator. Further various logic gates can be replaced. For example, a person skilled in the art may replace logic gates using De Morgan's theorem.

Figure 17:
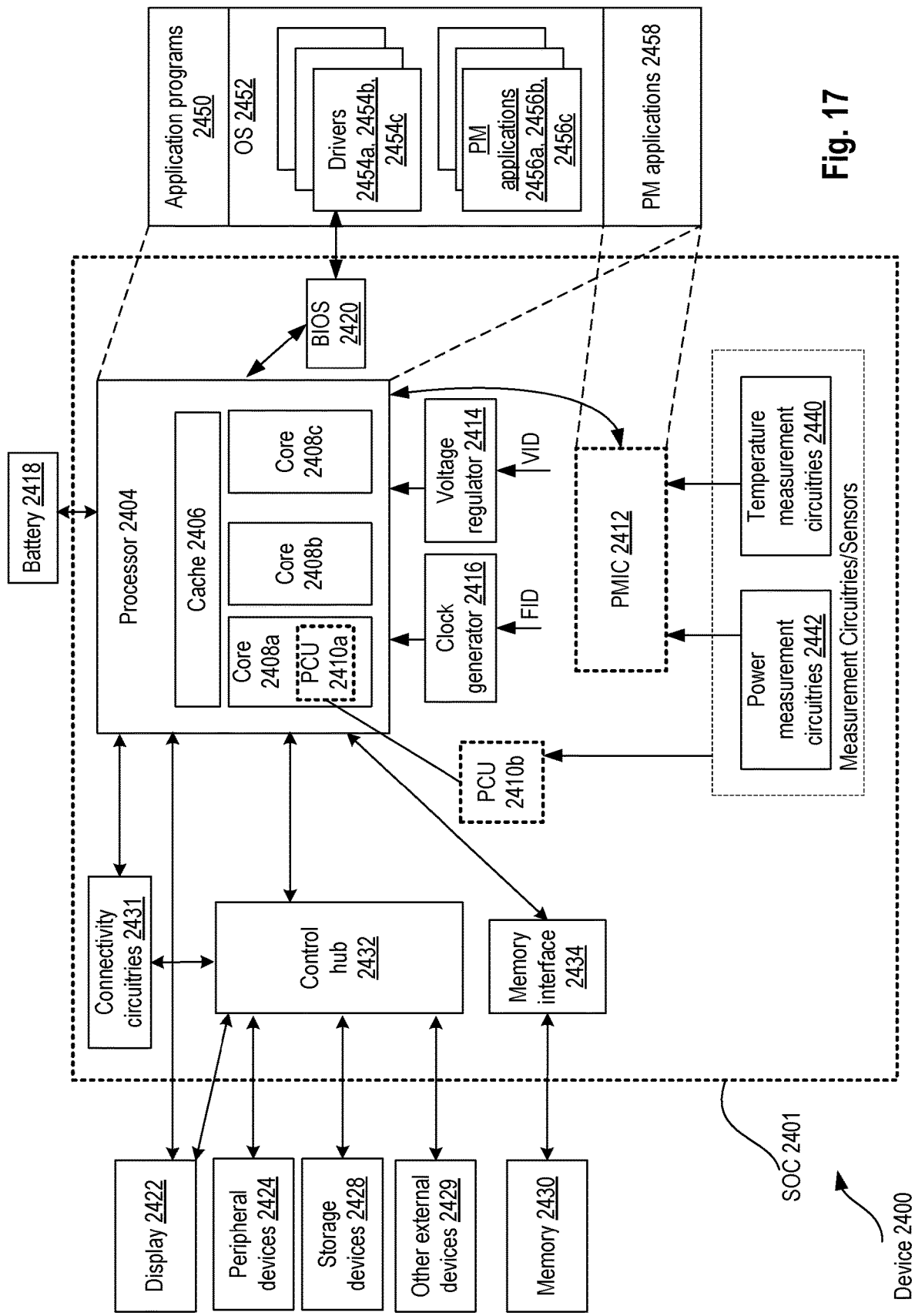
FIG. 17 illustrates a smart device or a computer system or a SoC (System-on-Chip) with multi-reset and multi-clock synchronizer, and/or synchronous multi-cycle reset synchronization circuit, in accordance with some embodiments.

FIG. 17 illustrates a smart device or a computer system or a SoC (System-on-Chip) with multi-reset and multi-clock synchronizer, and/or synchronous multi-cycle reset synchronization circuit, in accordance with some embodiments. Any block (hardware or software) in or associated with SoC 2401 can include multi-reset and multi-clock synchronizer, and/or synchronous multi-cycle reset synchronization circuit, in accordance with some embodiments.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises an SoC (System-on-Chip) 2401. An example boundary of the SoC 2401 is illustrated using dotted lines in FIG. 17, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 17, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410a/b has a capability to enable extra compute and telemetries resources for the runtime support of the pCode. Here pCode refers to a firmware executed by PCU 2410a/b to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SCO 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a first synchronizer circuit comprising at least two sequential circuits coupled in series, wherein the first synchronizer circuit is to pass a reset to a clock gate; and a second synchronizer circuit comprising at least two sequential circuits, wherein the second synchronizer circuit is to substantially eliminate a possible glitch from the reset, and to provide at least two clock cycle relaxation to propagation of de-assertion of the reset.

Example 2: The apparatus of example 1 comprises a multi-cycle path coupled to an output of the first synchronizer circuit, and to an input of the second synchronizer circuit, wherein the multi-cycle path is to increase an amount of time to propagate the reset.

Example 3: The apparatus of example 2, wherein the multi-cycle path comprises a flip-flip to align interlocked resets between synchronous clocks of different frequencies.

Example 4: The apparatus of example 2, wherein a first of the sequential circuits, of the at least two sequential circuits of the first synchronizer circuit, is to assert reset upon assertion of an input reset.

Example 5: The apparatus of example 4 comprises a NAND gate to prevent a glitch on a clock when the reset asserts.

Example 6: The apparatus of example 4, wherein the reset is to propagate through the multi-cycle path and the second synchronizer circuit to change an output of the second synchronizer.

Example 7: The apparatus of example 4 comprises a clock enable pin that is to remain asserted while the reset is asserted.

Example 8: The apparatus according to any one of examples 5 to 7, wherein the first sequential circuit of the first synchronizer circuit, is to assert its output upon de-assertion of the input reset, wherein the asserted output is to cause the NAND gate to behave as an inverter.

Example 9: The apparatus of example 5 comprises an output clock pin, which is to generate a clock for downstream sequential units, wherein the output clock pin is gated while the de-assertion of the input reset is to propagate through the second synchronizer circuit.

Example 10: An apparatus comprising: a first synchronizer circuit comprising at least two sequential circuits coupled in series, wherein the first synchronizer circuit is to pass a reset to a clock gate; a second synchronizer circuit comprising a sequential circuit, wherein the second synchronizer circuit is to substantially eliminate a possible glitch from the reset, and to provide at least two clock cycle relaxation to propagation of de-assertion of the reset; and at least one buffer coupled between the first synchronizer and the second synchronizer.

Example 11: The apparatus of example 10 comprises a multi-cycle path coupled to an output of the first synchronizer circuit, and to an input of the at least one buffer, wherein the multi-cycle path is to increase an amount of time to propagate the reset, wherein an output of the at least one buffer is coupled to an input of the second synchronizer circuit.

Example 12: The apparatus of example 11, wherein the multi-cycle path comprises a flip-flop to align interlocked resets between synchronous clocks of different frequencies.

Example 13: The apparatus of example 11, wherein a first of the sequential circuits, of the at least two sequential circuits of the first synchronizer circuit, is to assert reset upon assertion of an input reset.

Example 14: The apparatus of example 13 comprises a NAND gate to prevent a glitch on a clock when the reset asserts.

Example 15: The apparatus of according to any one of examples 11 to 14, wherein the reset is to propagate through the multi-cycle path and the second synchronizer circuit to change an output of the second synchronizer.

Example 16: An apparatus comprising: a first circuitry comprising a multi-reset and multi-clock synchronizer; and a second circuitry coupled to the first circuitry, wherein the first circuitry is to receive a first clock having a first frequency, wherein the second circuitry is to receive a second clock having a second frequency, wherein the second frequency is slower than the first frequency, wherein the first and second circuitries are to receive an input reset, and wherein the second circuitry comprises a multi-reset and multi-clock synchronizer.

Example 17: The apparatus of example 16, wherein the first circuitry comprises: a first synchronizer circuit comprising at least two sequential circuits coupled in series, wherein the first synchronizer circuit is to pass reset to a clock gate; and a second synchronizer circuit comprising at least two sequential circuit, wherein the second synchronizer circuit is to substantially eliminate a possible glitch from the reset, and to provide at least two clock cycle relaxation to propagation of de-assertion of the reset.

Example 18: The apparatus according to any one of examples 16 or 17, wherein the second circuitry comprises: a first synchronizer circuit comprising at least two sequential circuits coupled in series, wherein the first synchronizer circuit is to pass reset to a clock gate; and a second synchronizer circuit comprising at least two sequential circuit, wherein the second synchronizer circuit is to substantially eliminate a possible glitch from the reset, and to provide at least two clock cycle relaxation to propagation of de-assertion of the reset.

Example 19: A system comprising: a memory; a processor coupled to the memory; and a wireless interface to allow the processor to communicate with another device, wherein the processor includes an apparatus according to any one of examples 1 to 9.

Example 20: A system comprising: a memory; a processor coupled to the memory; and a wireless interface to allow the processor to communicate with another device, wherein the processor includes an apparatus according to any one of examples 10 to 15.

Example 21: A system comprising: a memory; a processor coupled to the memory; and a wireless interface to allow the processor to communicate with another device, wherein the processor includes an apparatus according to any one of examples 16 to 18.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus comprising:
  a first synchronizer circuit comprising at least two sequential circuits coupled in series, wherein the first synchronizer circuit is to pass a reset to a clock gate; and a second synchronizer circuit comprising at least two sequential circuits, wherein the second synchronizer circuit is to substantially eliminate a possible glitch from the reset, and to provide at least two clock cycle relaxation to propagation of de-assertion of the reset.

2. The apparatus of claim 1, further comprising a multi-cycle path coupled to an output of the first synchronizer circuit, and to an input of the second synchronizer circuit, wherein the multi-cycle path is to increase an amount of time to propagate the reset.

3. The apparatus of claim 2, wherein the multi-cycle path comprises a flip-flip to align interlocked resets between synchronous clocks of different frequencies.

4. The apparatus of claim 2, wherein a first of the sequential circuits, of the at least two sequential circuits of the first synchronizer circuit, is to assert reset upon assertion of an input reset.

5. The apparatus of claim 4, further comprising a NAND gate having inputs coupled to outputs of the first and second synchronizer circuits and an output to provide an enable signal for a clock to prevent a glitch on the clock when the reset asserts.

6. The apparatus of claim 4, wherein the reset is to propagate through the multi-cycle path and the second synchronizer circuit to change an output of the second synchronizer.

7. The apparatus of claim 4, further comprising a clock enable pin coupled to a logic gate that is coupled to the first and second synchronizer circuits, wherein the clock enable pin is to remain asserted while the reset is asserted.

8. The apparatus of claim 5, wherein the first sequential circuit of the first synchronizer circuit, is to assert its output upon de-assertion of the input reset, wherein the asserted output is to cause the NAND gate to behave as an inverter.

9. The apparatus of claim 5, further comprising an output clock pin from a clock gate circuit coupled to the NAND gate output through a latency flip-flop circuit, the output clock pin to generate a clock for downstream sequential units, wherein the output clock pin is gated while the de-assertion of the input reset is to propagate through the second synchronizer circuit.

10. An apparatus comprising:
a first synchronizer circuit comprising at least two sequential circuits coupled in series, wherein the first synchronizer circuit is to pass a reset to a clock gate;
a second synchronizer circuit comprising a sequential circuit, wherein the second synchronizer circuit is to substantially eliminate a possible glitch from the reset, and to provide at least two clock cycle relaxation to propagation of de-assertion of the reset; and
at least one buffer coupled between the first synchronizer and the second synchronizer.

11. The apparatus of claim 10, further comprising a multi-cycle path coupled to an output of the first synchronizer circuit, and to an input of the at least one buffer, wherein the multi-cycle path is to increase an amount of time to propagate the reset, wherein an output of the at least one buffer is coupled to an input of the second synchronizer circuit.

12. The apparatus of claim 11, wherein the multi-cycle path comprises a flip-flip to align interlocked resets between synchronous clocks of different frequencies.

13. The apparatus of claim 11, wherein a first of the sequential circuits, of the at least two sequential circuits of the first synchronizer circuit, is to assert reset upon assertion of an input reset.

14. The apparatus of claim 13, further comprising a NAND gate having inputs coupled to outputs of the first and second synchronizer circuits and an output to provide an enable signal for a clock to prevent a glitch on the clock when the reset asserts.

15. The apparatus of claim 11, wherein the reset is to propagate through the multi-cycle path and the second synchronizer circuit to change an output of the second synchronizer.

16. An apparatus comprising:
a first circuitry comprising a multi-reset and multi-clock synchronizer; and
a second circuitry coupled to the first circuitry, wherein the first circuitry is to receive a first clock having a first frequency, wherein the second circuitry is to receive a second clock having a second frequency, wherein the second frequency is slower than the first frequency, wherein the first and second circuitries are to receive an input reset, and wherein the second circuitry comprises a multi-reset and multi-clock synchronizer, wherein the first circuitry comprises (i) a first synchronizer circuit comprising at least two sequential circuits coupled in series, wherein the first synchronizer circuit is to pass reset to a clock gate, and (ii) a second synchronizer circuit comprising at least two sequential circuits, wherein the second synchronizer circuit is to substantially eliminate a possible glitch from the reset, and to provide at least two clock cycle relaxation to propagation of de-assertion of the reset.

17. The apparatus of claim 16, wherein the second circuitry comprises:
a first synchronizer circuit comprising at least two sequential circuits coupled in series, wherein the first synchronizer circuit is to pass reset to a clock gate; and
a second synchronizer circuit comprising at least two sequential circuit, wherein the second synchronizer circuit is to substantially eliminate a possible glitch from the reset, and to provide at least two clock cycle relaxation to propagation of de-assertion of the reset.

18. A system comprising:
a memory;
a processor coupled to the memory; and
a wireless interface to allow the processor to communicate with another device, wherein the processor includes an apparatus that includes:
a first synchronizer circuit comprising at least two sequential circuits coupled in series, wherein the first synchronizer circuit is to pass a reset to a clock gate; and
a second synchronizer circuit comprising at least two sequential circuits, wherein the second synchronizer circuit is to substantially eliminate a possible glitch from the reset, and to provide at least two clock cycle relaxation to propagation of de-assertion of the reset.

19. The system of claim 18, wherein the apparatus further comprises a multi-cycle path coupled to an output of the first synchronizer circuit, and to an input of the second synchronizer circuit, wherein the multi-cycle path is to increase an amount of time to propagate the reset.

20. The system of claim 19, wherein the multi-cycle path comprises a flip-flip to align interlocked resets between synchronous clocks of different frequencies.

21. The system of claim 19, wherein a first of the sequential circuits, of the at least two sequential circuits of the first synchronizer circuit, is to assert reset upon assertion of an input reset.

22. The system of claim 21, wherein the apparatus further comprises a NAND gate having inputs coupled to outputs of the first and second synchronizer circuits and an output to provide an enable signal for a clock to prevent a glitch on the clock when the reset asserts.

23. The system of claim 21, wherein the reset is to propagate through the multi-cycle path and the second synchronizer circuit to change an output of the second synchronizer.

\* \* \* \* \*